United States Patent [19]
Yoon et al.

[11] Patent Number: 5,793,689
[45] Date of Patent: Aug. 11, 1998

[54] SENSE AMPLIFIER FOR MEMORY

[75] Inventors: Oh Sang Yoon, Seoul; Yong Soo Kim, Kyungki-Do, both of Rep. of Korea

[73] Assignee: LG Semicon Co., Ltd., Cheongju, Rep. of Korea

[21] Appl. No.: 581,788

[22] Filed: Jan. 2, 1996

[30]     Foreign Application Priority Data

Oct. 18, 1995 [KR] Rep. of Korea ............... 1995/35980

[51] Int. Cl.$^6$ ....................................................... G11C 7/00
[52] U.S. Cl. ..................... 365/205; 365/207; 365/189.01; 365/230.03
[58] Field of Search ............................. 365/205, 207, 365/189.01, 189.09, 208, 230.03

[56]          References Cited

U.S. PATENT DOCUMENTS 5,233,558   8/1993   Fujii et al. .
5,270,971  12/1993   Muraoka et al. ................. 365/189.01
5,566,116  10/1996   Kang ..................................... 365/205

Primary Examiner—David C. Nelms
Assistant Examiner—Hoai Ho
Attorney, Agent, or Firm—Fleshner & Kim

[57]          ABSTRACT

A sense amplifier for a memory which is capable of preventing a ground bouncing and waste of electric power generated in a column sense amplifier where a column selection signal is enabled and a word line is disabled, by connecting a switching element to each ground terminal of the column sense amplifiers included in each cell array block, which includes a plurality of cell array blocks; and a plurality of switching circuits for stabilizing ground voltages of the cell array blocks by being switched in accordance with each switching signal being enabled when a word line is enabled, and respectively controlling ground current of the cell array blocks.

10 Claims, 4 Drawing Sheets

SENSE AMPLIFIER FOR MEMORY

BACKGROUND OF THE INVENTION

1. Field of the Invention

The present invention relates to a sense amplifier for a memory, and particularly to an improved sense amplifier for a memory which is capable of preventing a ground bouncing and waste of electric power generated in a column sense amplifier where a column selection signal is enabled and a word line is disabled, by connecting a switching element to each ground terminal of the column sense amplifiers included in each cell array block.

2. Description of the Conventional Art

Referring to FIG. 1, a conventional sense amplifier includes an "n" number of cell array blocks, and the cell array blocks each includes an "m" number of sense amplifiers.

The "m" number of sense amplifiers each include a bit line sense amplifier BLSA and a column sense amplifier CSA connected to bit lines bit and bitb, and each column sense amplifier CSA is connected to a write enable signal WES, read data buses RDB and RDBb, and write data buses WDB and WDBb. Column selection signals CSS1 to CSSN are connected to at least two column sense amplifiers CSAs.

Referring to FIG. 2, assume that a column selection signal CSS1 of an "n" number of column selection signals CSS1 to CSSN is selected. Each column sense amplifier CSA includes a write gate circuit WGC for writing in a memory cell the data inputted via the write data buses WDB and WDBb in accordance with the column selection signal CSS1 and the write enable signal WES via a pair of bit lines bit and bitb; and a read amplifier RAC for outputting data loaded on read data buses RDB and RDBb in accordance with electric potential of the column selection signal CSS1 and bit lines bit and bitb.

The write gate circuit WGC includes NMOS transistors MN1 and MN2 each having a gate to which a write enable signal WES is commonly connected, and each having a drain to which write buses WDB and WDBb are connected; and NMOS transistors MN3 and MN4 each having a drain to which each source of the NMOS transistors MN1 and MN2 is connected, each having a gate to which the column selection signal CSS1 is commonly connected, and each having a source to which bit lines bit and bitb are respectively connected.

The read amplifier RAC includes NMOS transistors MN5 and MN6 each having a gate to which the column selection signal CSS1 is commonly connected, and each having a source to which read data buses RDB and RDBb are respectively connected; NMOS transistors MN7 and MN8 each having a drain to which each drain of the NMOS transistors MN5 and MN6 is respectively connected, each having a gate to which the bit lines bit and bitb are respectively connected, and each having a source to which ground terminal is commonly connected.

As shown in FIG. 3, the conventional sense amplifier for a memory in which the write enable signal is connected to each column sense amplifier of FIG. 1 includes bit line sense amplifier BLSA and column sense amplifier CSA connected to the bit lines bit and bitb.

The column sense amplifier CSA is connected to write enable signal WES, read data buses RDB and RDBb, write data buses WDB and WDBb, and read enable signal RES. Each column selection signal CSS1 to CSSN is connected to at least two column sense amplifiers CSAs.

The column sense amplifier CSA includes a write gate circuit WGC; and a read amplifier RAC which outputs electric potential loaded on the column selection signal CSS1 and bit lines bit and bitb, and outputs electric potential loaded on read data buses RDB and RDBb in accordance with the write enable signal WES.

The write gate circuit WGC includes NMOS transistors MN1 to MN4, as illustrated above. The read amplifier RAC includes NMOS transistors MN5 and MN6 each having a gate to which column selection signal CSS1 is commonly connected, and each having a source to which read data buses RDB and RDBb are respectively connected; NMOS transistors MN7 and MN8 each having a drain to which each drain of the NMOS transistors MN5 and MN6 is connected, and each having a gate to which the bit lines bit and bitb are connected, respectively; and NMOS transistor MN9 having a drain to which each source of the NMOS transistors MN7 and MN8 are commonly connected, having a gate to which read enable signal RES is connected, and a source to which ground terminal is connected.

The operations of the conventional sense amplifier for the memory constructed as explained above will be explained.

First, when a user designates an address to record a data, that is, in write cycle state, one column signal of the "n" number of column selection signals CSS1 to CSSN is enabled by a column decoder, and a word line in an optional cell array block is enabled by a row decoder, thereby write enable signal WES of high level is inputted.

Here, the case where column selection signal CSS1 is enabled and the word line is enabled in the nth cell array block is explained.

The NMOS transistors MN1 and MN2 of the write gate circuit WGC are turned on in accordance with the inputted write enable signal WES of high level, and NMOS transistors MN3 and MN4 of the write gate circuit WGC are turned on in accordance with the column selection signal CSS1 of high level, thereby data via write data buses WDB and WDBb is stored to a memory cell via the NMOS transistors MN1 and MN3, the NMOS transistors MN2 and MN4, and bit lines bit and bitb, successively.

On the other hand, when a user designates an address to draw out a data stored in the memory cell, that is, in read cycle state, both the column selection signal CSS1 and word line of the nth cell array block can be enabled, or sometimes the column selection signal CSS1 is enabled and the word line of the nth cell array block is disabled.

In the above two cases, write enable signal WES which is enabled in write cycle becomes disabled.

Here, the case where the column selection signal CSS1 is enabled and the word line of the nth cell array block is enabled is explained as follows.

First, bit lines bit and bitb are maintained in a predetermined precharge level by a precharge circuit.

Here, if the internal electric potential of the precharge circuit is VDD, precharge level becomes VDD/2.

As the word line is enabled, since the electric potential stored in the memory cell is loaded on the bit lines bit and bitb, there is a difference of electric potentials between the bit lines bit and bitb. Since the difference of the electric potential is very minute, the difference is amplified via the bit line sense amplifier BLSA, thereby being applied to each gate of the NMOS transistors MN7 and MN8 via the bit lines bit and bitb.

The difference of electric potential between the bit lines bit and bitb can be generated in cases where electric potential of the memory cell is loaded on the bit line bit, and electric potential of the memory cell is loaded on the bit line bitb.

Here, for example, the case where electric potential of the memory cell is loaded on the bit line bit is explained.

As respective electric potentials amplified via the bit line sense amplifier BLSA are supplied to the bit line bit in high level, and applied to the bit line bitb in low level, the NMOS transistors MN7 and MN8 are turned on and turned off, respectively, in accordance with high and low electric potentials applied to their each gate.

Further, NMOS transistors MN5 and MN6 are turned on in accordance with the column selection signal CSS1 of high level.

Accordingly, the electric potential loaded on read data bus RDB is grounded via the NMOS transistors MN5 and MN7, successively, and electric potential loaded on read data bus RDBb is outputted via an output buffer.

Meanwhile, as shown above, when the column selection signal CSS1 is enabled and the word line is disabled, the bit lines bit and bits are maintained in an optional precharge level, that is, maintained in VDD/2 state, thereby being applied to each gate of the NMOS transistors MN7 and MN8.

During the column selection signal CSS1 is maintained in the enable state, since the NMOS transistors MN5 to MN8 are turned on, current flows from the read data buses RDB and RDBb to ground voltage.

On the other hand, as shown in FIG. 3, the operations of the conventional sense amplifier for a memory in which read enable signal RES is connected respectively to each column sense amplifier CSA will be explained as follows.

First, the operation of the column sense amplifier CSA in write cycle is omitted as it is explained above.

In read cycle state, when the column selection signal CSS1 and word line of the nth cell array block are enabled, the read enable signal RES of high level is applied to a gate of NMOS transistor MN9, and the NMOS transistor MN9 is turned on.

Here, the read enable signal RES becomes high level when the word line is enabled, whereas, it becomes low level when the word line is disabled.

As illustrated above, electric potential loaded on the read data bus RDB is grounded successively via NMOS transistors MN5, MN7 and MN9, and electric potential loaded on the read data bus RDBb is outputted via the output buffer.

When the column selection signal CSS1 is enabled and the word line is disabled, the read enable signal RES of low level is applied to the gate of the NMOS transistor MN9, thereby the NMOS transistor MN9 is turned off.

Accordingly, during the column selection signal CSS1 is maintained in the enable state, current flowing from the write data buses RDB and RDBb to the ground terminal is blocked by the NMOS transistors MN9.

However, the conventional sense amplifier for the memory has a problem in that ground terminal becomes unstable, that is, ground bouncing is generated, because NMOS transistor of the column sense amplifier is directly connected to ground terminal, thereby sensing noise which can be generated in sensing the data stored in the memory cell is directly carried to the ground terminal.

Further, during the column selection signal is enabled and word line is disabled, since current flows from the read data buses to ground terminal of the read amplifier, there is a problem of waste of electric power.

Although the above described two problems are improved by the secondly illustrated conventional sense amplifier for the memory, the amplifier still has a problem of overall circuitry layout in that an NMOS transistor is additionally included in the each column sense amplifier.

SUMMARY OF THE INVENTION

Therefore, it is an object of the present invention to provide a sense amplifier for a memory which is capable of preventing a ground bouncing and waste of electric power generated in a column sense amplifier where a column selection signal is enabled and a word line is disabled, by connecting a switching element to each ground terminal of the column sense amplifiers included in each cell array block.

To achieve the above-described object, the circuit according to the present invention includes first to nth cell array blocks; and first to nth switching circuits for stabilizing ground voltages of the cell array blocks by being switched in accordance with each switching signal being enabled when a word line is enabled, and respectively controlling ground current of the cell array blocks.

BRIEF DESCRIPTION OF THE DRAWINGS

The above object and advantages of the present invention will be more clearly understood from the following detailed description taken in conjunction with the accompanying drawings, in which.

DETAILED DESCRIPTION OF THE PREFERRED EMBODIMENTS

Figure 1:
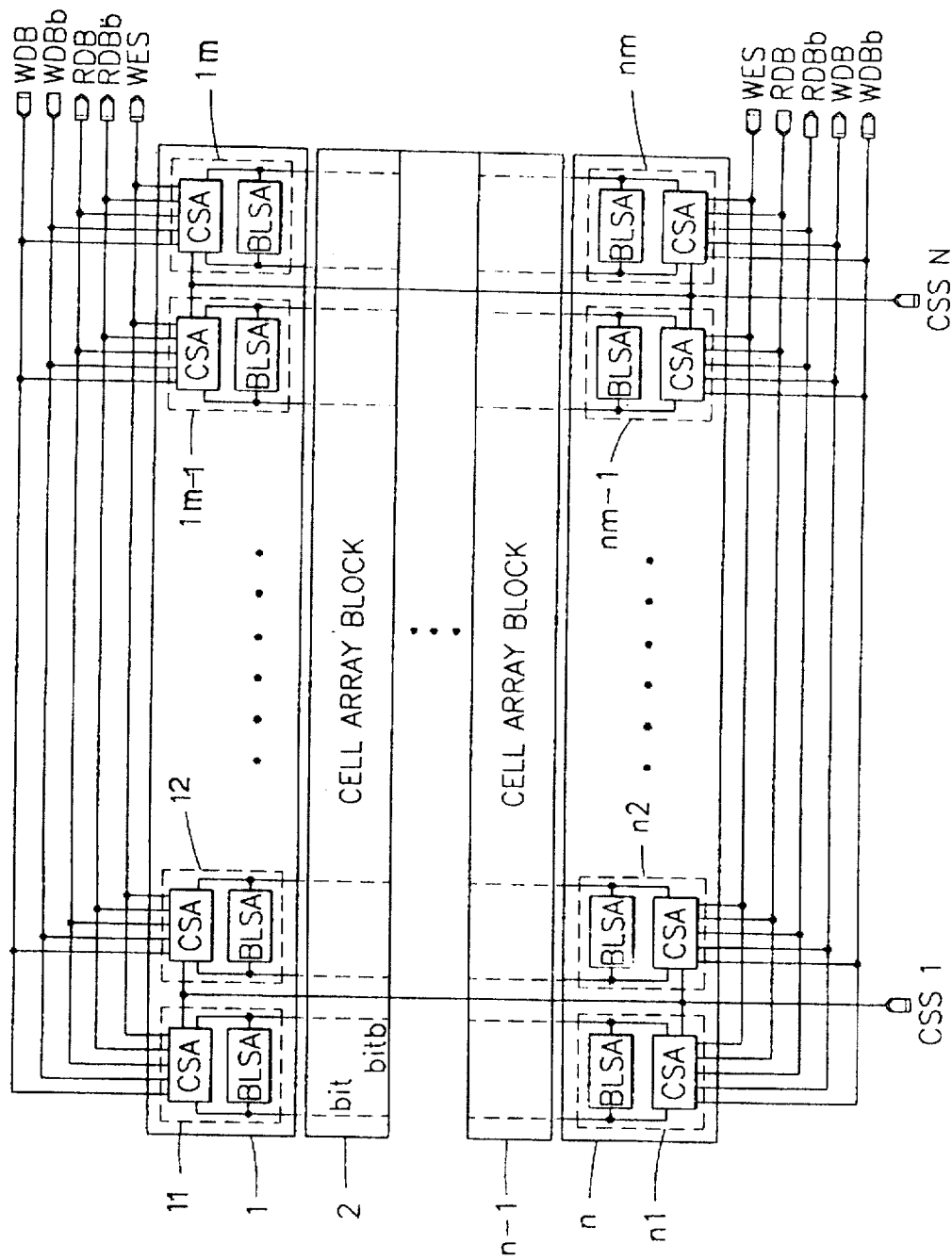
FIG. 1 is a block diagram of a conventional sense amplifier for a memory.
Figure 2:
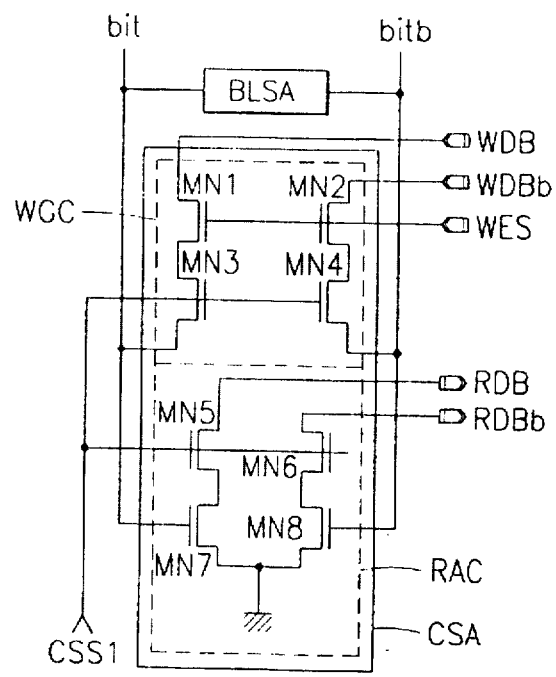
FIG. 2 is a detailed circuit diagram of a column sense amplifier in FIG. 1.
Figure 3:
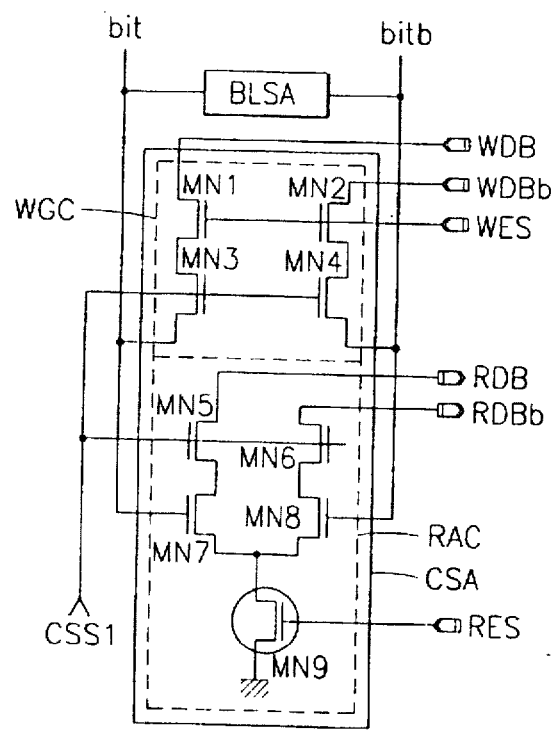
FIG. 3 is a detailed circuit diagram of the column sense amplifier when connecting a read enable signal line to the column sense amplifier in FIG. 1.
Figure 4:
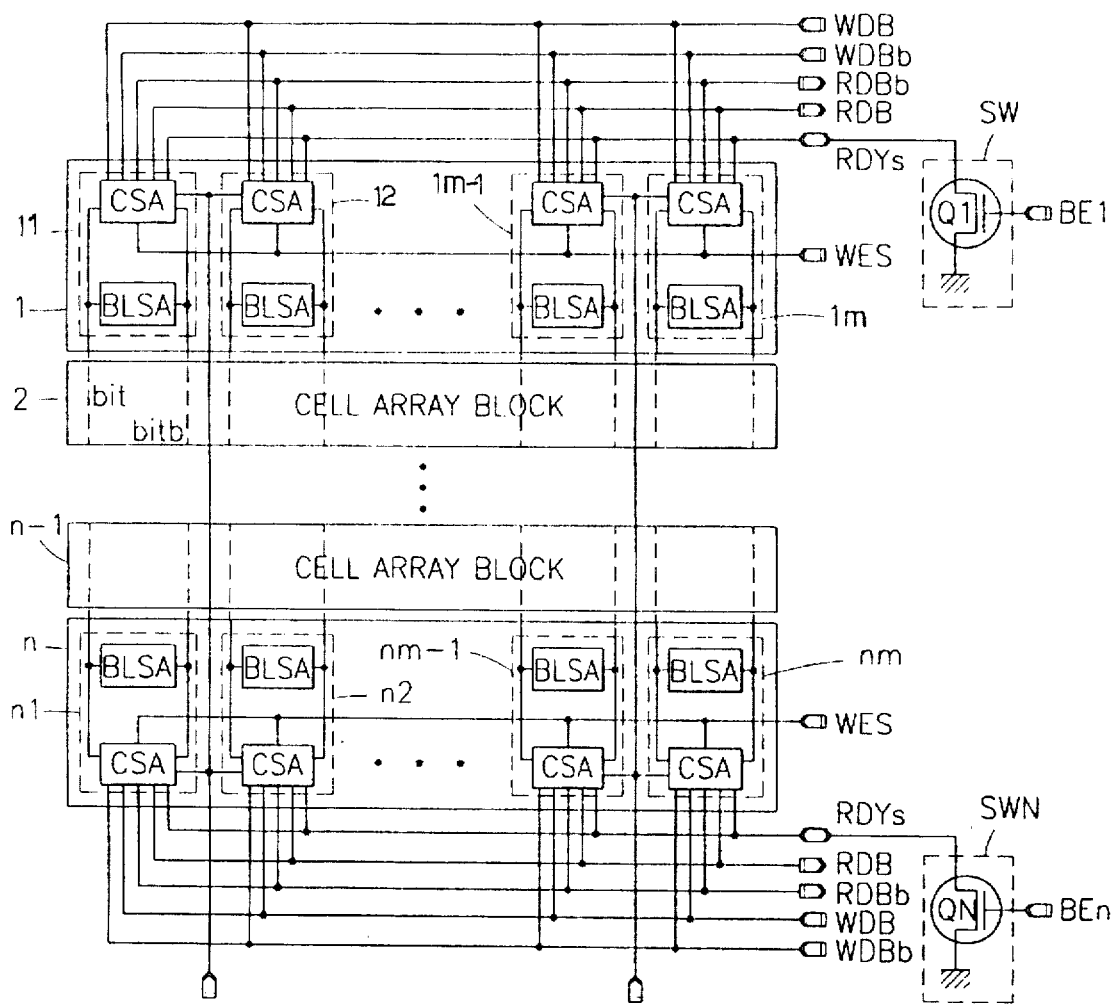
FIG. 4 is a block diagram of a sense amplifier for a memory according to the present invention.

Referring to FIG. 4, the sense amplifier for a memory according to the present invention includes an "n" number of cell array blocks; and an "n" number of switching circuits SW1 to SWN being switched in accordance with each switching signal BE1 to BEN being enabled when a word line is enabled, and controlling ground currents of the first to nth cell array blocks.

The 1st to nth cell array blocks each includes an "m" number of sense amplifiers, and the sense amplifiers each include a bit line sense amplifier BLSA and a column sense amplifier CSA connected to bit lines bit and bitb.

The switching circuits SW1 to SWN include NMOS transistors Q1 to QN, respectively.

Each column sense amplifier CSA is connected to a write enable signal WES, read data buses RDB and RDBb, write data buses WDB and WDBb, and each drain of the NMOS transistors Q1 to QN in the switching circuits SW1 to SWN, respectively. Each column selection signal CSS1 to CSSN is connected to at least two column sense amplifiers CSAs.

Figure 5:
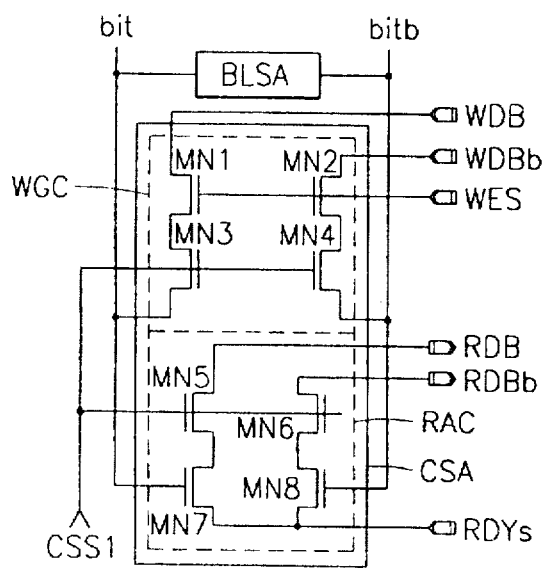
FIG. 5 is a detailed circuit diagram of a column sense amplifier in FIG. 4.

Further, as shown in FIG. 5, when the column selection signal CSS1 of the "n" number of column selection signals CSS1 to CSSN is selected, the column sense amplifier CSA includes the write gate circuit WGC and a read amplifier RAC, as explained above.

The write gate circuit WGC includes NMOS transistors MN1 to MN4, as explained above.

The read amplifier RAC includes NMOS transistors MN5 and MN6 each having a gate to which the column selection signal CSS1 is commonly connected, and each having a source to which read data buses RDB and RDBb are respectively connected; and NMOS transistors MN7 and MN8 each having a drain to which each drain of the NMOS transistors MN5 and MN6 is respectively connected, each having a gate to which the bit lines bit and bitb are respectively connected, and having a source to which a connection line RDY of the switching circuits SW1 to SWN is commonly connected.

The detailed operations will be explained as follows.

First, as the operation of the sense amplifier in write cycle state is similar to that of the conventional one, the detailed descriptions will be omitted here.

While, the operation of the sense amplifier in read cycle will be explained. When the column selection signal CSS1 is enabled and the word line of the nth cell array block is enabled, the write enable signal WES being enabled in write cycle is disabled.

As the word line is enabled, a switching signal BEN is applied to the switching circuit SWN.

As the level of the switching signal BEN can be controlled inside of the circuit, the switching element SWN can include an NMOS transistor or a PMOS transistor.

Here, as shown in FIG. 4, assume that the switching circuits SW1 to SWN include each corresponding NMOS transistor Q1 to QN.

As the word line of the nth cell array block is enabled, the switching signal BEN of high level is applied to a gate of the NMOS transistor QN in the switching element SWN.

As illustrated above, when the word line is enabled, since electric potential stored in a memory cell is supplied to the bit line bit, there is a difference of electric potential between the bit lines bit and bitb which were in a precharge level before the word line is enabled.

The difference of electric potentials between the bit lines bit and bitb is amplified via the bit line sense amplifier BLSA, and high and low electric potentials are applied to each gate of the NMOS transistors MN7 and MN8, respectively.

The NMOS transistors MN7 and MN8 are turned on and turned off, respectively in accordance with the electric potentials of the high and low levels, and the NMOS transistors MN5 and MN6 are turned on, respectively in accordance with the column selection signal CSS1 of high level.

Accordingly, the electric potential loaded on the read data bus RDB is applied to a drain of the NMOS transistor QN in the switching circuit SWN via the NMOS transistors MN5 and MN7, successively. The voltage applied to the drain of the NMOS transistor QN is grounded via a source of the NMOS transistor QN.

Meanwhile, when the column selection signal CSS1 is enabled and the word line is disabled, a predetermined precharge electric potential is maintained in the bit lines bit and bitb, thereby being applied to each gate of the NMOS transistors MN7 and MN8.

Further, as the word line is disabled, the switching signal BEN of low level is applied to the gate of the NMOS transistor QN, and the NMOS transistor QN is turned off.

Accordingly, since the NMOS transistors MN5 to MN8 are turned on when the column selection signal CSS1 is maintained in the enable state, the current flowing from the read data buses RDB and RDBb to the switching element connection line RDYS is blocked by the NMOS transistor QN being turned off.

Another embodiment of the sense amplifier of the memory according to the present invention will be explained, referring to the drawings.

Figure 6:
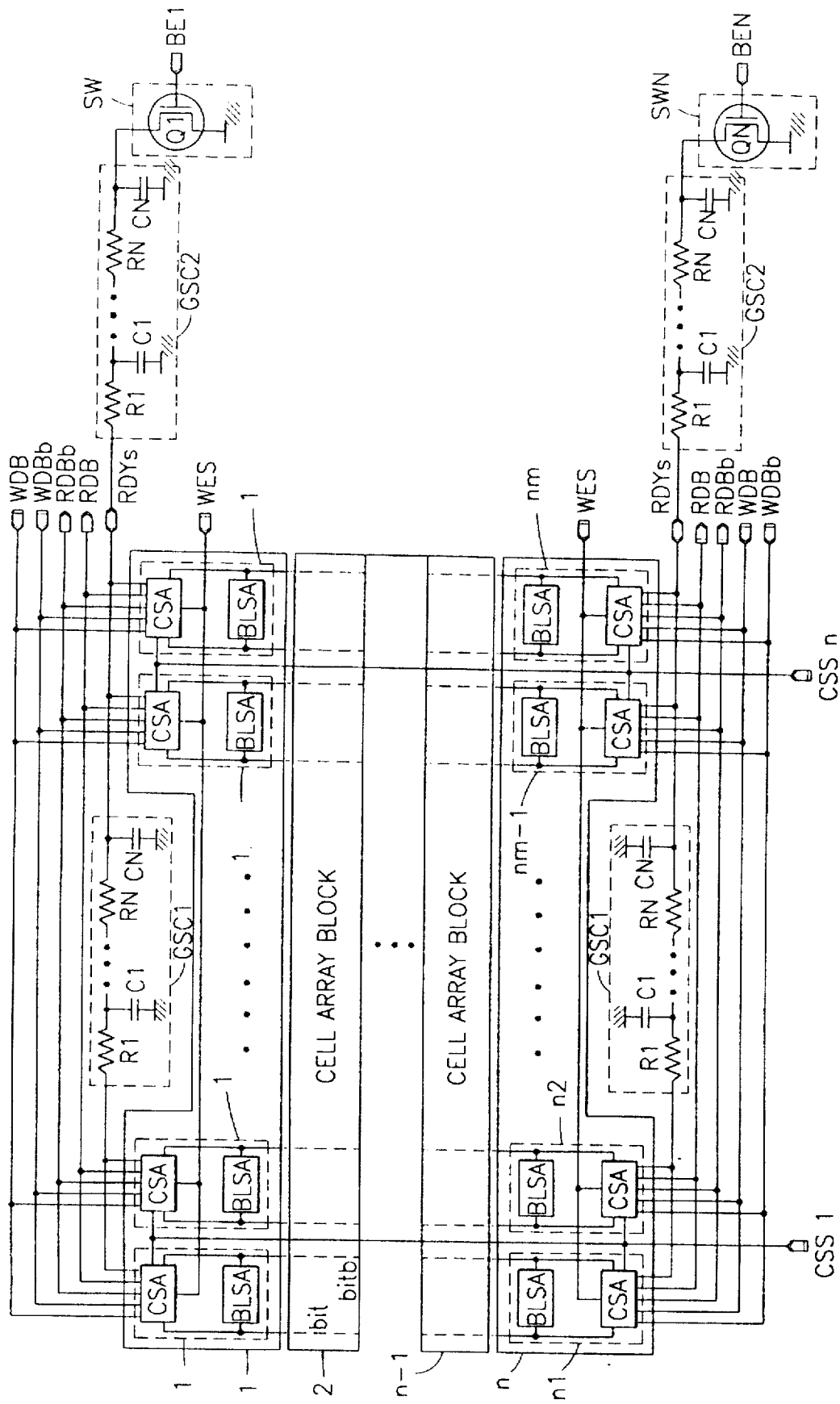
FIG. 6 is a diagram showing another embodiment of FIG. 4.

As shown in FIG. 6, the sense amplifier includes an "n" number of cell array blocks; ground voltage stabilizing circuits GSC1 and GSC2 for stabilizing ground voltages of the "n" number of cell array blocks; and switching circuit SW1 to SWN for controlling currents of the ground voltage stabilizing circuits GSC1 and GSC2 by being switched in accordance with the switching signals BE1 to BEN being enabled when the word line is enabled.

The ground voltage stabilizing circuits GSC1 and GSC2 having an "n" number of parallelly connected resistors and capacitors R1, C1 to RN, CN are connected together in series.

The detailed operations of another embodiment of the sense amplifier of the memory according to the present invention will be explained.

First, as the operation of the sense amplifier in write cycle is explained above, the detailed description is omitted here.

While, the operation of the sense amplifier in read cycle will be explained. When the column selection signal CSS1 is enabled and the word line of the nth cell array block is enabled, the write enable signal WES being enabled in write cycle is disabled.

As the word line of the nth cell array block is enabled, a switching signal BEN of high level is applied to the gate of the NMOS transistor QN in the switching circuit SWN, thereby the NMOS transistor QN is turned on.

When the word line is enabled, since electric potential stored in a memory cell is supplied to the bit line bit, there is a difference of electric potential between the bit lines bit and bitb which were in a precharge level before the word line is enabled.

The difference of electric potentials between the bit lines bit and bitb is amplified via the bit line sense amplifier BLSA, and high and low electric potentials are applied to each gate of the NMOS transistors MN7 and MN8, respectively.

The NMOS transistors MN7 and MN8 are turned on and turned off, respectively in accordance with the electric potentials of the high and low levels, and the NMOS transistors MN5 and MN6 are turned on, respectively in accordance with the column selection signal CSS1 of high level.

Accordingly, the electric potential loaded on the read data bus RDB passes the NMOS transistors MN5 and MN7, successively, and is delayed by a plurality of resistors and capacitors R1, C1 to RN, CN, thereby applied to the drain of the NMOS transistor QN in the switching element SWN.

The voltage applied to the drain of the NMOS transistor QN is grounded via a source of the NMOS transistor QN.

On the other hand, when the column selection signal CSS1 is enabled and the word line is disabled, a precharge electric potential is maintained in the bit lines bit and bitb, and respectively applied to each gate of the NMOS transistors MN7 and MN8.

Accordingly, since the NMOS transistors MN5 to MN8 are respectively turned on when the column selection signal CSS1 is maintained in the enable state, currents flowing from the read data buses RDB and RDBb to each source of the NMOS transistors MN7 and MN8 are applied to the drain of the NMOS transistor QN via resistors and capacitors R1, C1 to RN, CN of the ground voltage stabilizing circuits GSC1 and GSC2.

Further, as the switching signal BEN of low level is applied to the gate of the NMOS transistor QN and the NMOS transistor QN is turned off, the current applied to the drain of the NMOS transistor QN is blocked by the NMOS transistor QN.

As described above, according to the present invention, a sense amplifier for the memory prevents a ground bouncing as sensing noise is not carried directly to the ground terminal by disconnecting the NMOS transistor of the column sense amplifier from the ground terminal. Further, when the column selection signal is enabled and the word line is disabled, current flowing from the read data buses to the ground terminal of the read amplifier is blocked, thereby reducing waste of electric power.

Additionally, by connecting a single switching element to each cell array block, the overall circuitry layout area can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sense amplifier for a memory including a plurality of cell array blocks, wherein the sense amplifier comprises:
   a plurality of switching circuits, each for stabilizing a ground voltage of a corresponding one of said plurality of cell array blocks, wherein said plurality of switching circuits are switched in accordance with a corresponding switching signal to be enabled when a word line for the corresponding one of said plurality of cell array blocks is enabled, and respectively controlling a ground current of the plurality of cell array blocks.

2. The amplifier of claim 1, wherein said plurality of switching circuits include each corresponding NMOS transistor.

3. The amplifier of claim 1, wherein said plurality of switching circuits include each corresponding PMOS transistor.

4. The amplifier of claim 1, further comprises a plurality of ground voltage stabilizing circuits between said cell array blocks and said switching circuits.

5. The amplifier of claim 4, wherein said ground voltage stabilizing circuits include a plurality of resistors and capacitors coupled in parallel.

6. The sense amplifier of claim 1, wherein when a selected column selection line is enabled and a selected word line is disabled, the corresponding one of the plurality of cell array blocks is decoupled from a ground terminal by a corresponding switching circuit.

7. A memory device comprising:
   a plurality of memory cell blocks, wherein each block comprises,
      a read bus,
      a write bus;
   a plurality of sense amplifiers coupled to the read bus and the write bus, said plurality of sense amplifiers being coupled to a plurality of memory cells; and
   a plurality of switches, each switch of said plurality of switches coupled to all of said plurality of sense amplifiers of one corresponding memory cell block of said plurality of memory cell blocks and for establishing a ground voltage of a corresponding one of said plurality of cell array blocks.

8. The memory device of claim 7, wherein when a corresponding column selection line is enabled and a selected word line is disabled, the corresponding read data bus is decoupled from a ground terminal.

9. A memory device, comprising:
   a plurality of bit lines;
   a plurality of write and read data busses;
   a plurality of cell array blocks, wherein each cell array block is coupled to a corresponding one of the write and read data busses, and wherein said each cell array block includes a plurality of memory cells coupled to a plurality of sense amplifiers, and wherein each sense amplifier comprises,
      a plurality of bit line sense amplifiers coupled to a corresponding bit line pair of the plurality of bit lines, and
      a plurality of column sense amplifiers having a read gate circuit coupled to the corresponding read data bus and a write gate circuit coupled to the corresponding write data bus; and
   a plurality of switching circuits, each for stabilizing a ground voltage of a corresponding one of said plurality of cell array blocks, wherein said plurality of switching circuits are switched in accordance with a corresponding switching signal to be enabled when a word line for the corresponding one of said plurality of cell array blocks is enabled, and respectively controlling a ground current of the plurality of cell array blocks.

10. The memory device of claim 9, wherein when a selected column selection switch is enabled and a selected word line is disabled, the corresponding read data bus is decoupled from a ground terminal.

\* \* \* \* \*